United States Patent
Tanaka et al.

(10) Patent No.: US 6,275,123 B1
(45) Date of Patent: Aug. 14, 2001

(54) SURFACE ACOUSTIC WAVE MATCHED FILTER WITH DISPERSIVE SUBSTRATE AND SAW GROUP VELOCITY BASED OUTPUT ELECTRODE DESIGN

(75) Inventors: Mitsuhiro Tanaka, Chita-Gun; Tomohiko Shibata, Kasugai; Yuji Hori, Owariasahi, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/351,944

(22) Filed: Jul. 12, 1999

(30) Foreign Application Priority Data

Jul. 16, 1998 (JP) .................................................. 10-201648

(51) Int. Cl.[7] .............................. H03H 9/64; H03H 9/42; H04B 1/69

(52) U.S. Cl. .......................... 333/193; 333/154; 333/196; 375/153

(58) Field of Search ..................................... 333/150–155, 333/193–196; 375/153

(56) References Cited

U.S. PATENT DOCUMENTS

| | | | |
|---|---|---|---|
| 4,506,239 | * | 3/1985 | Cho et al. .......................... 333/154 X |
| 5,353,304 | * | 10/1994 | Mochizuki ........................ 333/153 X |
| 5,815,055 | * | 9/1998 | Eguchi et al. ......................... 333/193 |
| 5,905,449 | * | 5/1999 | Tsubouchi et al. ............... 333/194 X |
| 5,909,461 | * | 6/1999 | Koga et al. ....................... 333/193 X |
| 6,061,342 | * | 5/2000 | Tsubouchi et al. ................... 370/342 |

FOREIGN PATENT DOCUMENTS

| | | |
|---|---|---|
| 0 915 564 | 5/1999 | (EP) . |
| 2181918 | 4/1987 | (GB) . |
| 5-235691 | * 9/1993 | (JP) . |

OTHER PUBLICATIONS

Meier, H. et al., "CAD Modeling of Saw Filters in Mobile Communication Systems," Proceeding in the Pacific RIM Conference on Communications, Computers and Signal Processing, US, NY, IEEE, May 19, 1993, pp. 718–721.

Haartsen, J.C., "A Differential–Delay Saw Correlator for Combined DSSS Despreading and DPSK Demodulation," IEEE Transactions on Communications, US, NY, IEEE, vol. 41, No. 9, Sep. 1, 1993, pp. 1278–1280.

Tsubouchi et al., "Zero–Temperature–Coefficient Saw Devices on AlN Epitaxial Films," IEEE Transactions on Sonics and Ultrasonics, US, NY, IEEE, vol. 32, No. 5, Sep. 1985, pp. 634–644.

Nakahata, H. et al., "High Frequency Surface Acoustic Wave Filter Using ZnO/Diamond/Si Structure," IEEE Ultrasonic Symposium, US, NY, IEEE, vol. 1, Oct. 20, 1992, pp. 377–380.

* cited by examiner

*Primary Examiner*—Robert Pascal
*Assistant Examiner*—Barbara Summons
(74) *Attorney, Agent, or Firm*—Burr & Brown

(57) ABSTRACT

A surface acoustic wave matched filter for use in a spread spectrum communication system is disclosed. The surface acoustic wave matched filter includes a substrate having dispersity and is composed of a sapphire main body and a piezoelectric aluminum nitride. A tap distance L of an output side electrode is designed on the basis of a group velocity $v_g$ instead of a phase velocity $v_s$ in order to match the tap distance L with an input spread spectrum signal and to improve a correlation peak level of an output demodulated signal. When the tap distance L is set to satisfy a condition of $v_g/f_1 \times 0.97 \leq L \leq v_g/f_1 \times 1.02$, a decrease in the correlation peak level of the matched filter can be improved from 7 dB to a value smaller than 3 dB, and S/N of the output demodulated signal can be increased. Thus, the disclosed device renders it no longer necessary to process the output demodulated signal by a complicated and power consuming circuit.

7 Claims, 6 Drawing Sheets

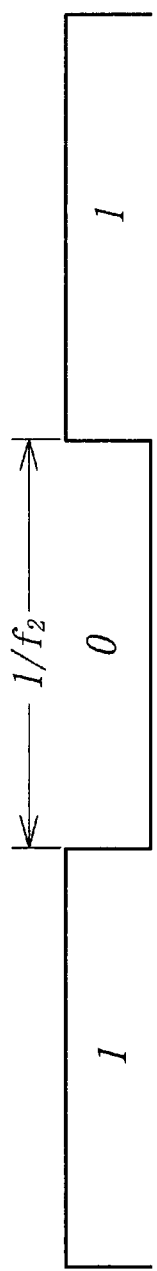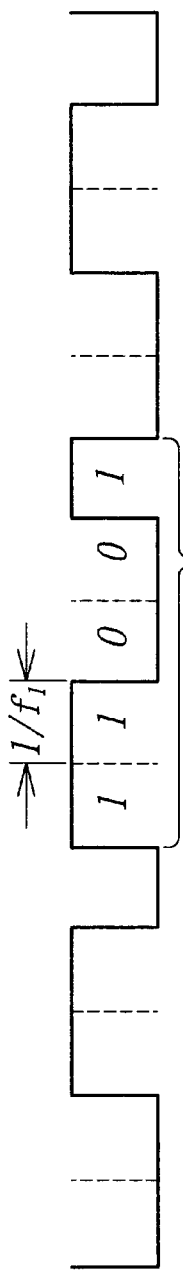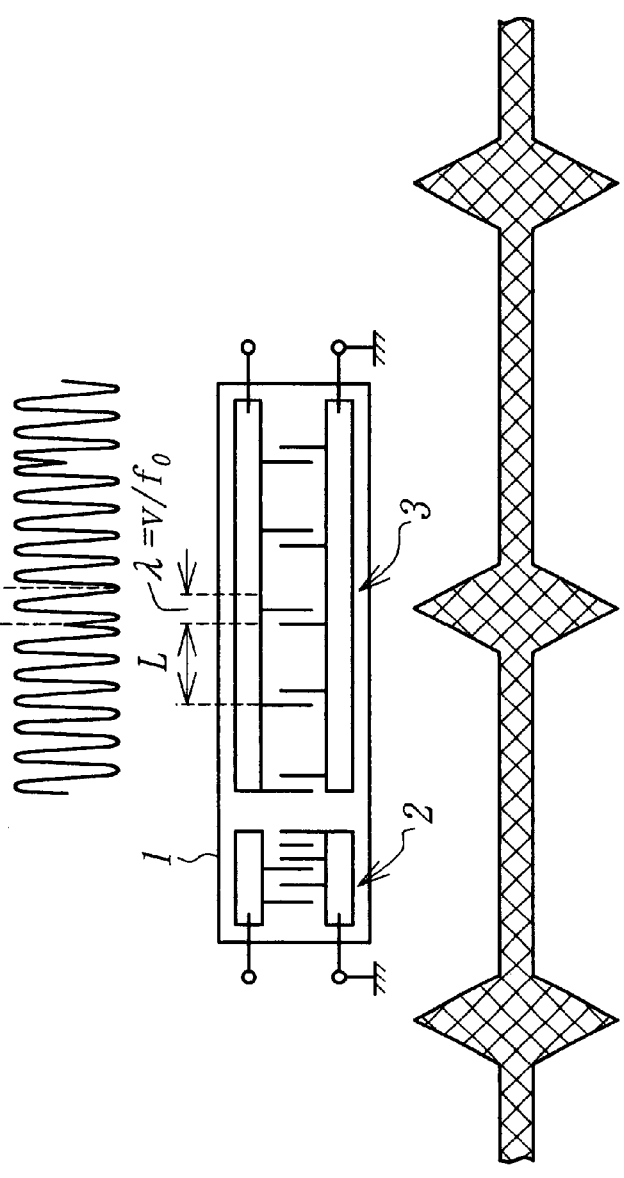
FIG. 1A  FIG. 1B  FIG. 1C  FIG. 1D  FIG. 1E

SURFACE ACOUSTIC WAVE MATCHED FILTER WITH DISPERSIVE SUBSTRATE AND SAW GROUP VELOCITY BASED OUTPUT ELECTRODE DESIGN

BACKGROUND OF THE INVENTION

1. Field of the Invention

The present invention relates to a surface acoustic wave matched filter comprising a substrate, which includes a piezoelectric material. An input side electrode is provided on a surface of the substrate for converting a received input spread spectrum signal into a surface acoustic wave. An output side electrode is provided on a surface of the substrate for receiving a surface acoustic wave propagated from the input side electrode. The output side electrode is constructed to constitute a tapped delay line for producing a demodulated output signal.

2. Related Art Statement

The above mentioned surface acoustic wave filter, also called a correlator, has been widely used for demodulating an input spread spectrum signal in a spread spectrum communication. FIGS. 1A–1E are schematic views for explaining the general operation of such a spread spectrum communication. FIG. 1A illustrates a base band signal to be transmitted, and a data rate of the base band signal is denoted by $f_2$ (bits/sec). The base band signal is then converted into a PN code having a code length N=5. In this example, a code "1" is denoted by "11001" and a code "0" by "00110" as depicted in FIG. 1B. The PN code has a chip rate of $f_1$. By modulating a carrier having a frequency $f_0$ with the PN code, a spread spectrum signal shown in FIG. 1C can be obtained. Therefore, the spread spectrum signal has a center frequency of $f_0$.

The obtained spread spectrum signal is transmitted over a transmission path and is supplied to an input side electrode 2 of a surface acoustic wave matched filter 1 as shown in FIG. 1D. The input side electrode 2 converts the received spread spectrum signal into a surface acoustic wave. The surface acoustic wave matched filter 1 further comprises an output side electrode 3 from which a demodulated signal may be obtained. The output side electrode 3 is constructed by a tapped delay line including electrode fingers having a period $\lambda$ of $v/f_0$, a tap distance $L=v/f_1$ and a tap pattern corresponding to the polarity of the PN code, wherein v is a velocity of the surface acoustic wave propagating along the surface of a substrate 1 of the surface acoustic wave matched filter.

In the known surface acoustic wave matched filter, the output side electrode 3 constituting the tapped delay line is designed such that the tap distance L is equal to $v/f_1$. It should be noted that the velocity v of the surface acoustic wave is a phase velocity. The phase velocity may be defined as a velocity at which a sinusoidal wave having a single frequency propagates along the surface of the substrate 1. In the known surface acoustic wave matched filter, the synchronization between the output side electrode 3 and the input spread spectrum signal can be difficult to attain, which causes a correlation peak level of the output signal to be decreased.

The inventors have conducted various experiments and analyses for the above mentioned decrease in the correlation peak level and have found that the tap distance of the matched filter is designed on the basis of the phase velocity of the surface acoustic wave. Recently, the substrate of the surface acoustic wave matched filter has been made of various materials. In order to make the operation frequency much higher, a laminated type substrate has been developed. For instance, the substrate is composed of a main body made of a material such as sapphire and diamond having a higher velocity for the surface acoustic wave and a thin film applied on the main body and made of a piezoelectric material such as aluminum nitride and zinc oxide. Upon use of such a thin film type substrate, a decrease in the correlation peak level has been remarkably observed.

The above mentioned decrease in the correlation peak level occurs because the known substrate made of a single crystal is substantially non-dispersive, but the thin film laminated type substrate has a dispersive characteristic which depends on film thickness. In this type of substrate revealing the dispersity, the surface acoustic wave propagates along the surface of the substrate predominantly at the group velocity instead of phase velocity. Therefore, when a surface acoustic wave matched filter having a thin film laminated type substrate is designed under a phase velocity, the spread spectrum signal cannot be detected in a synchronous manner by the output side electrode, which, in turn, causes a decrease in the correlation peak level.

The above mentioned problem of the decrease in the correlation peak level, due to the fact that the tap distance of the surface acoustic wave matched filter and the spread spectrum signal are not synchronized with each other, is not inherent to thin film laminated type substrates, but may equally occur in any kind of a substrate having such dispersity.

When the correlation peak level in the output demodulated signal is decreased, not only is the S/N of the output demodulated signal decreased, but there is also the requirement of a rather complicated and expensive circuit for processing the output demodulated signal having a low S/N. Consequently, a communication device having such a surface acoustic wave matched filter installed therein requires a large power consumption. This is particularly disadvantageous for portable type communication devices such as portable type telephone hand sets. Here, it should be noted that the S/N of the output demodulated signal from the surface acoustic wave matched filter is defined by a ratio of the correlation peak value of the matched filter output to a maximum side lobe peak value of output other than correlation peak.

SUMMARY OF THE INVENTION

The present invention has for its object to provide a novel and useful surface acoustic wave matched filter, in which the above mentioned problems of the known filters can be removed or mitigated. Specifically, the undesired decrease in the correlation peak level of the output demodulated signal due to the dispersity of the piezoelectric substrate, can be effectively removed without using a complicated and expensive signal processing circuit which requires a large power consumption.

According to the invention, a surface acoustic wave filter comprising a substrate including a piezoelectric material and having a surface, an input side electrode provided on the surface of said substrate for converting a received input spread spectrum signal into a surface acoustic wave, and an output side electrode provided on the surface of the substrate for receiving said surface acoustic wave propagated from the input side electrode, said output side electrode being constructed to constitute a tapped delay line for producing a demodulated output signal, wherein said output side electrode is designed in accordance with a group velocity of the surface acoustic wave.

In a preferable embodiment of the surface acoustic wave matched filter according to the invention, the tap distance L of the output side electrode is designed to satisfy the following condition;

$$v_g/f_1 \times 0.97 \leq L \leq v_g/f_1 \times 1.02$$

wherein $f_1$ is a chip rate of a PN code and $v_g$ is the group velocity of the surface acoustic wave. By selecting the tap distance L of the output side electrode to a value within the range defined by the above condition, undesired decrease in S/N of the output demodulated signal from an ideal value can be restricted to about 3 dB. Therefore, it is possible to realize a surface acoustic wave matched filter having a practically usable high S/N.

According to the invention, it is preferable that the substrate is composed of a thin film type substrate including a main body made of sapphire ($Al_2O_3$) or diamond (C) and a piezoelectric thin film applied on the main body made of a piezoelectric material such as aluminum nitride (AlN) and zinc oxide (ZnO). Such a thin film type substrate is particularly applicable to the high frequency communication system because the sapphire and diamond have a very high surface acoustic velocity. Furthermore, according to the invention, it is also possible to use a substrate including a main body formed by a silicon base member having a diamond thin film applied on the silicon base member and a piezoelectric thin film provided on the diamond thin film.

In general, the surface acoustic wave energy is confined within a substrate surface region having a thickness of substantially one to two times of a wavelength of the surface acoustic wave. Therefore, in the above mentioned thin film type substrate, a thickness of the uppermost piezoelectric thin film may be smaller than substantially one to two times of a wavelength of the surface acoustic wave.

BRIEF DESCRIPTION OF THE DRAWINGS

FIGS. 1A–1E are schematic views explaining the general operation of the surface acoustic wave matched filter;

DESCRIPTION OF THE PREFERRED EMBODIMENT

Figure 2A:
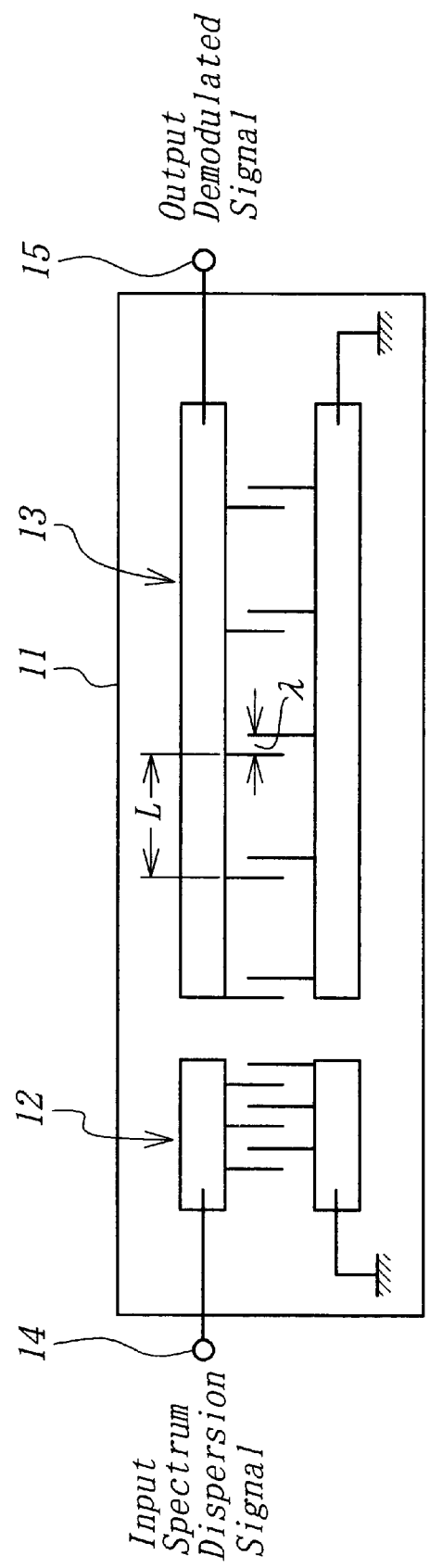
FIG. 2A is a schematic plan view showing an embodiment of the surface acoustic wave matched filter according to the invention.
Figure 2B:
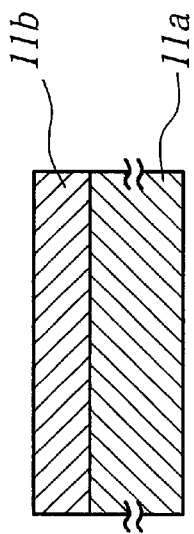
FIG. 2B is a cross sectional view depicting a thin film type substrate.

FIG. 2A is a schematic plan view showing an embodiment of the surface acoustic wave (SAW) matched filter according to the invention. In the present embodiment, the SAW matched filter comprises a piezoelectric substrate 11, an input side electrode 12 provided on a surface of the substrate 11 for converting a received spread spectrum signal into a surface acoustic wave, and an output side electrode 13 provided on the substrate 11 for receiving the surface acoustic wave from the input side electrode 12. The output side electrode produces an output demodulating signal representing a correlation between the electrode configuration of the output side electrode 13 and the spread spectrum signal. As illustrated in FIG. 2B, in the present embodiment, the piezoelectric substrate 11 includes a sapphire main body 11a having a thickness of about 0.5 mm and a piezoelectric thin film 11b applied on the main body 11a. The piezoelectric thin film is made of aluminum nitride (AlN) and has a thickness of substantially 1 µm. Since the surface acoustic wave can propagate on the sapphire main body 11a at a high speed, a high frequency SAW matched filter can obtained.

Assuming that an electrode pitch of the electrode fingers of the output side electrode 13 is denoted by $\lambda$, a tap distance, i.e. a distance between adjacent electrode fingers of the output side electrode 13 by L, a center frequency of the input spread spectrum signal by $f_0$, a chip rate of the PN code by $f_1$, and a data rate of the base band signal is expressed by $f_2$. In the known SAW matched filter, the tap distance L has been designed on the basis of the phase velocity $v_s$ of the surface acoustic wave. That is to say, the tap distance L has been determined by $L=v_s/f_1$. In general, since the electrode pitch $\lambda$ is given by $\lambda=v_s/f_0$, the following equation may be obtained:

$$L=f_0\lambda/f_1 \quad (1)$$

For instance, when the center frequency $f_0$ of the spread spectrum signal is 2484 MHz and the chip rate $f_1$ of the PN code is 22 MHz, the tap distance L becomes 112.9 $\lambda$. In this case, the PN code is 11 chip Barker code. In this manner, in the known SAW matched filter, the tap distance L has been designed on the basis of the phase velocity $v_s$. Thus, it has been confirmed that a level of the correlation peak of the output demodulated signal is decreased, and therefore S/N of the output demodulated signal is also lowered.

In the SAW matched filter according to the invention, the tap distance L of the output side electrode 13 is designed not on the basis of the phase velocity $v_s$, but on the basis of the group velocity $v_g$. It is well known that between the phase velocity $v_s$ and the group velocity $v_g$ there is the following relationship:

$$v_g \approx v_s + k(dv_s/dk) \quad (2)$$

wherein $k=2\pi/\lambda$.

In the known SAW matched filter, the piezoelectric substrate is made of a single crystal and shows non-dispersity and the phase velocity $v_s$ is substantially identical with the group velocity $v_g$. Therefore, there is substantially no difference between the case in which the tap distance L is designed in accordance with the phase velocity $v_s$ and the case in which the tap distance is determined on the basis of the group velocity $v_g$. However, the substrate 11 of the present embodiment has dispersity and the group velocity $v_g$ differs from the phase velocity $v_s$ to a non-negligibly large extent. Therefore, if the tap distance L is designed on the basis of the phase velocity $v_s$, the tap distance L deviates from an ideal value and the correlation peak level might be decreased.

Figure 3:
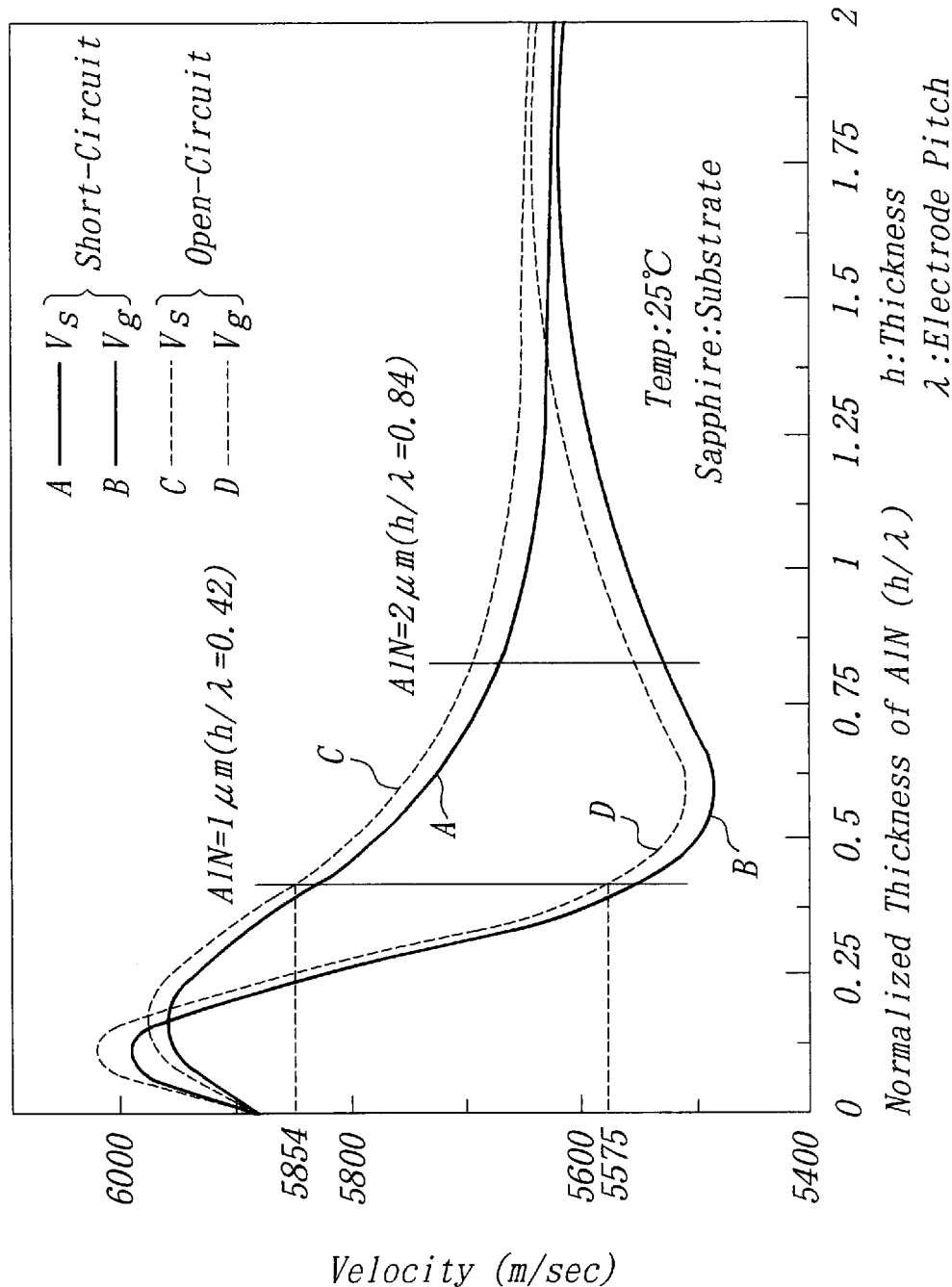
FIG. 3 is a graph representing a relationship between a relative thickness of a thin film constituting a substrate of the surface acoustic wave matched filter and phase and group velocities.

FIG. 3 is a graph showing a relationship between a thickness h of the aluminum nitride 11b provided on the sapphire main body 11a and the phase and group velocities $v_s$ and $v_g$ at a temperature of 25° C., the thickness h being normalized by the wavelength $\lambda$ (h/$\lambda$). Curves A and B denote the phase velocity $v_s$ and group velocity $v_g$ in a short-circuit structure, in which a whole surface of the substrate is assumed to be covered with an electrically conductive film having a zero thickness. Curves C and D represent the phase velocity $v_s$ and group velocity $v_g$ in an open-circuit structure, in which a whole surface of the substrate is not covered with such an electrically conductive film. In the actual SAW matched filter, a total surface area of the electrodes is extremely smaller than a total surface area of the substrate, and thus the phase velocity $v_s$ and group velocity $v_g$ in the open-circuit structure should be adopted. For instance, if an actual thickness h of the aluminum nitride thin film 11b is 1 μm (h/λ=0.42), the phase velocity $v_s$ is 5854 m/sec and the group velocity $v_g$ is 5575 m/sec.

In the above numerical example, when the tap distance L of the SAW matched filter is designed in accordance with the phase velocity $v_s$, the chip rate $f_1$ may be calculated in the following manner. When the piezoelectric aluminum nitride thin film 11b of the substrate 11 is 1 μm, the phase velocity $v_s$ becomes 5854 m/sec and the group velocity $v_g$ becomes 5575 m/sec as stated above. Therefore, if the chip rate $f_1$ is calculated such that it is matched with the tap distance L (=112.9 λ) calculated on the basis of the phase velocity $v_s$ in accordance with the prior art conception, the following equation (4) may be obtained.

$$f_1 = v_g/L = v_g/112.9\lambda \qquad (3)$$
$$= 5575/(112.9 \times 5854 \div 2484) = 20.953 \text{ MHz}$$

That is to say, when the tap distance L is calculated in accordance with the phase velocity $v_s$, the chip rate $f_1$ becomes 20.953 MHz, which deviates from the ideal value of 22 MHz by more than 4%.

When the SAW matched filter is designed in accordance with the conception of the present invention, it is possible to make the tap distance L to be matched with the desired chip rate $f_1$ by setting the tap distance L to 107.5 λ, instead of 112.9 λ. By designing the tap distance L in accordance with the group velocity $v_g$, the tap distance L can be accurately matched with the desired chip rate $f_1$, and therefore the correlation peak level can be increased.

The above mentioned tap distance L of 107.5 λ may be calculated in the following manner. When the phase velocity $v_s$ is 5854 m/sec and the center frequency $f_0$ of the input spread spectrum signal is 2484 MHz, the electrode pitch λ is given by $$\lambda = v_s/f_0 = 5848/2484 = 2.357 \text{ μm}.$$

Therefore, the tap distance L may be derived from the following equation:

$$L = \frac{253.4}{2.357}\lambda = 107.5\lambda \qquad (4)$$

Figure 4:
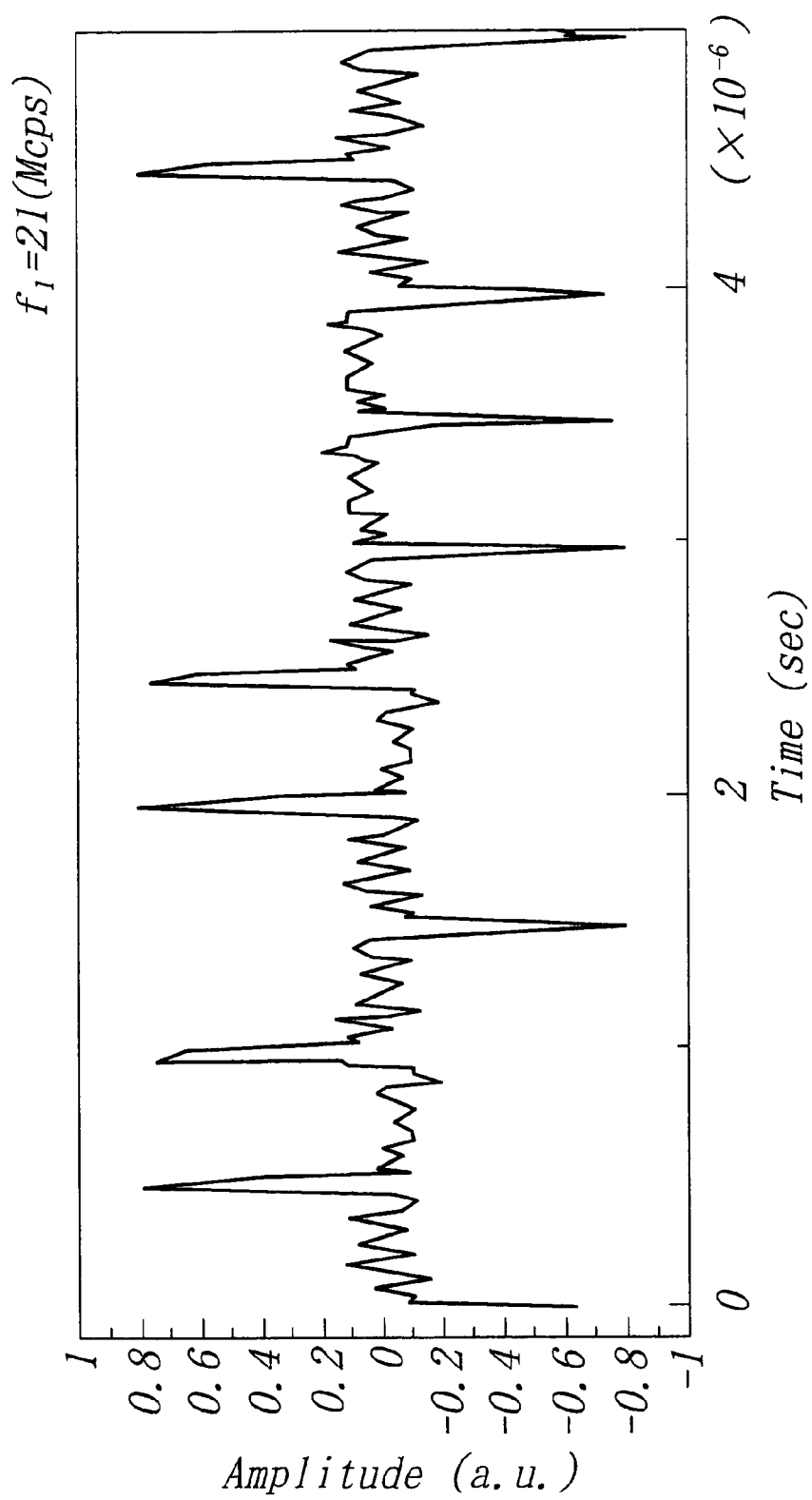
FIG. 4 is a graph showing an output demodulated signal from the known surface acoustic wave matched filter.

FIG. 4 is a graph showing a typical signal waveform of the output demodulated signal from the known SAW matched filter which is designed on the basis of the phase velocity $v_s$.

Figure 5:
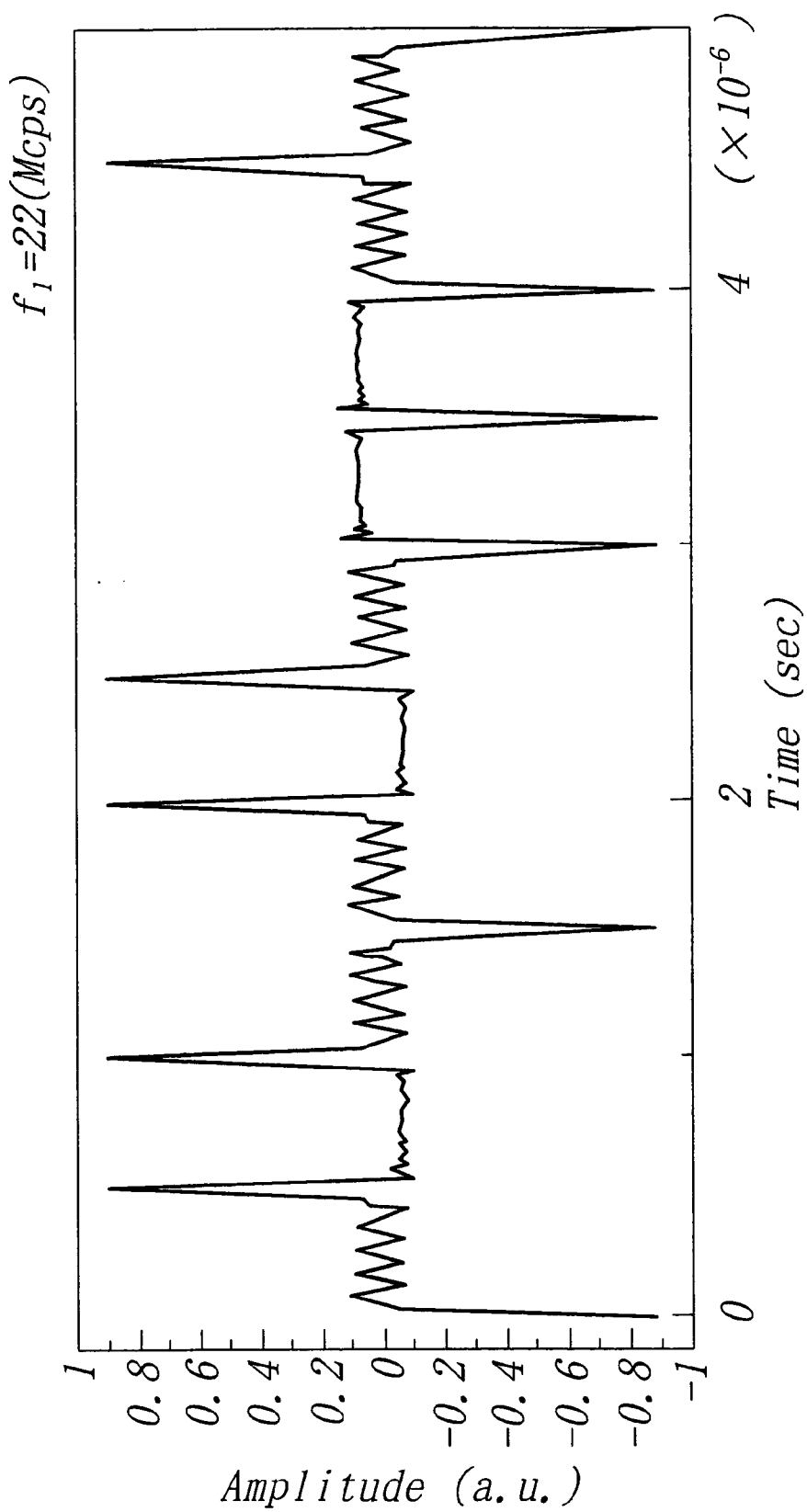
FIG. 5 is a graph depicting an output demodulated signal from the novel surface acoustic wave matched filter according to the invention.

FIG. 5 is a similar graph representing the output demodulated signal obtained by the SAW matched filter designed on the basis of the group velocity $v_g$ according to the invention. As shown in FIG. 4, in the known SAW matched filter, the chip rate $f_1$ is set to 20.953 MHz, instead of the ideal frequency of 22 MHz. Upon comparing these graphs, one can easily understand that the correlation peak level of the known SAW matched filter is lower than that of the novel SAW matched filter according to the invention.

Figure 6:
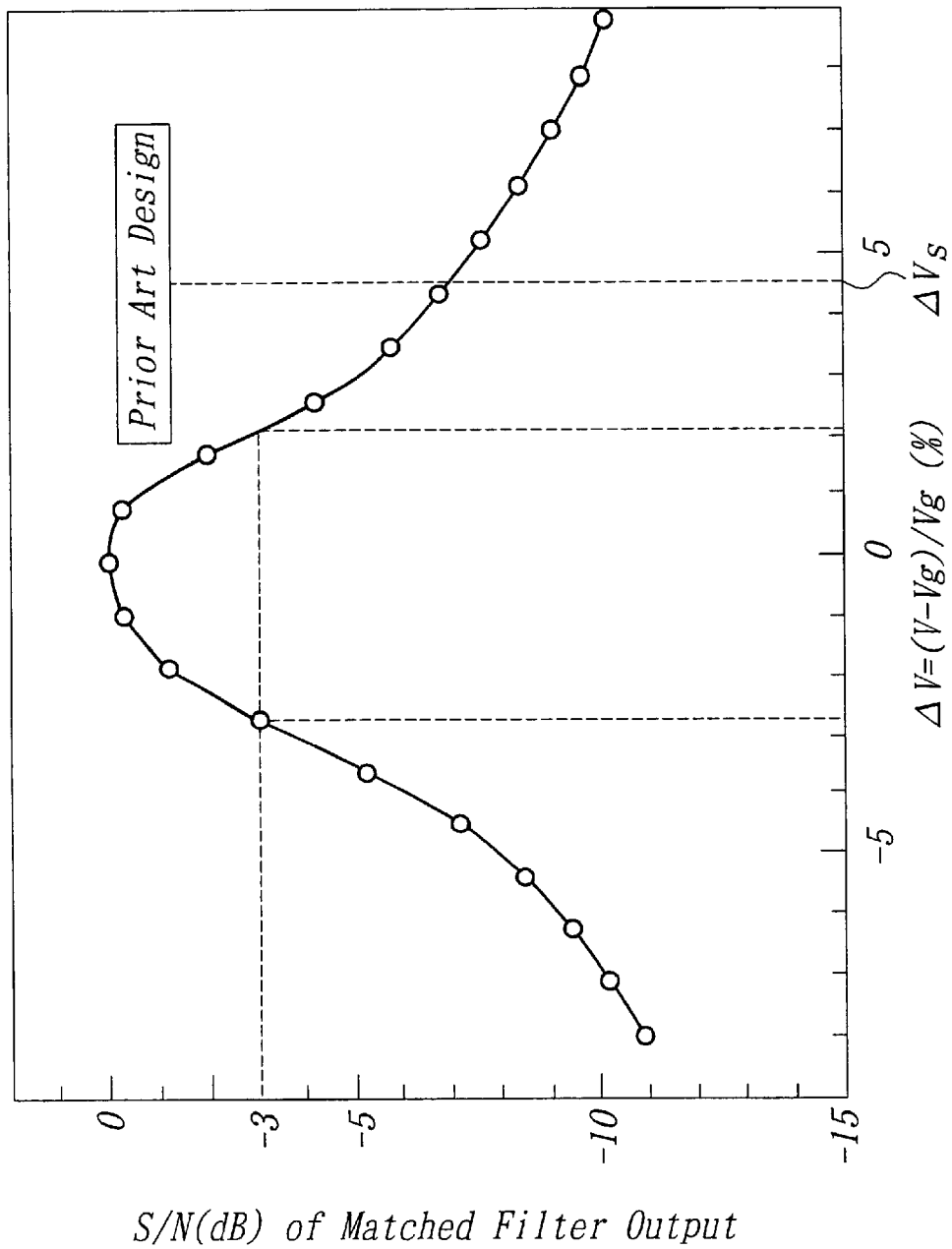
FIG. 6 is a graph representing a relationship between a deviation from an ideal tap distance and S/N of the output demodulated signal in the surface acoustic wave matched filter according to the invention.

FIG. 6 is a graph representing a change in S/N of the output demodulated signal from the SAW matched filter in accordance with a deviation $\Delta V$ in a design velocity from the group velocity $v_g$ ($\Delta V=(v-v_g)/v_g \times 100\%$). In FIG. 6, S/N of the output signal obtained from the ideal SAW matched filter designed on the basis of the group velocity $v_g$ is denoted as 0 dB. In FIG. 6, there is shown a deviation $\Delta V_s$ in the velocity from the group velocity $v_g$ in the known SAW matched filter in which the tap distance L is designed in accordance with the phase velocity $v_s$. In this known SAW filter, S/N of the output demodulated signal is decreased by about 7 dB and compared with the ideal SAW matched filter designed using the group velocity $v_g$ (i.e. $\Delta V=0$). As a result of various experiments and analyses, the inventors have confirmed that a sufficiently usable SAW matched filter can be obtained as long as the decrease in S/N of the output demodulated signal from the ideal value is not larger than 3 dB. Therefore, according to the invention, the tap distance L is preferably set to a value within a range from −3% to +2% of the ideal value. That is to say, according to the invention, it is possible to realize a SAW matched filter having a small decrease in the correlation peak level by satisfying the following condition:

$$V_g/f_1 \times 0.97 \leq L \leq V_g/f_1 \times 1.02 \qquad (5)$$

The present invention is not limited to the embodiment explained above, but various alternations and modifications may be conceived by a person skilled in the art without departing from the scope of the invention. For instance, in the above embodiment, the substrate is formed by a sapphire main body and a thin film of aluminum nitride applied on the main body. According to the invention, the sapphire main body may be replaced by a diamond main body, and the thin film of aluminum nitride may be replaced by a piezoelectric zinc oxide thin film. Furthermore, the substrate may be composed of a silicon base, a diamond film applied on the silicon base and a piezoelectric thin film applied on the diamond film. It should be noted that the design concept according to the invention may be applied to any type of substrates that reveal dispersity.

Furthermore, it should be noted that the above numerical values and PN code are shown only for the exemplary sake, and the present invention is not restricted to such numerical values and PN code.

In the surface acoustic wave matched filter according to the present invention, since the tap distance of the output side electrode is designed not on the basis of the phase velocity but on the basis of the group velocity, the correlation peak level of the output demodulated signal is improved and S/N of the output demodulated signal is high. Therefore, the output demodulated signal can be processed by a rather simple circuit and power consumption can be decreased. Due to such benefits, the surface acoustic wave matched filter may be particularly advantageously used in a small portable type communication system.

What is claimed is:

1. A surface acoustic wave matched filter comprising a substrate having dispersity and including a piezoelectric material and having a surface, an input side electrode provided on the surface of said substrate for converting a received input spread spectrum signal into a surface acoustic wave, and an output side electrode provided on the surface of the substrate for receiving said surface acoustic wave propagated from the input side electrode, said output side electrode being constructed to constitute a tapped delay line for producing a demodulated output signal, wherein said output side electrode is designed in accordance with a group velocity of the surface acoustic wave.

2. A surface acoustic wave matched filter as claimed in claim 1, wherein a tap distance L of the output side electrode is designed to satisfy the following condition;

$$v_g/f_1 \times 0.97 \leq L \leq v_g/f_1 \times 1.02$$

wherein $f_1$ is a chip rate of a PN code of the spread spectrum signal and $v_g$ is the group velocity of the surface acoustic wave.

3. A surface acoustic wave matched filter as claimed in claim 2, wherein said tap distance L is set to a value $v_g/f_1$.

4. A surface acoustic wave matched filter as claimed in claim 1, wherein said substrate is composed of a silicon base, a diamond thin film applied on the silicon base, and a piezoelectric thin film provided on the diamond thin film and made of aluminum nitride or zinc oxide.

5. A surface acoustic wave matched filter as claimed in claim 1, wherein said substrate is composed of a thin film type substrate comprising a main body made of a material having a higher surface acoustic wave travelling velocity, and a piezoelectric thin film applied on the main body and made of a piezoelectric material.

6. A surface acoustic wave matched filter as claimed in claim 5, wherein said main body is made of sapphire ($Al_2O_3$) or diamond (C), and said thin film applied on the main body is made of aluminum nitride (AlN) or zinc oxide (ZnO).

7. A surface acoustic wave matched filter as claimed in claim 6, wherein said thin film made of the piezoelectric material has a thickness of about one to two times of a wavelength of the surface acoustic wave.

* * * * *